US012598912B2

(12) United States Patent
Chen et al.

(10) Patent No.: US 12,598,912 B2
(45) Date of Patent: Apr. 7, 2026

(54) ORGANIC LIGHT-EMITTING DIODE STRUCTURE AND DISPLAY DEVICE

(71) Applicant: BOE Technology Group Co., Ltd., Beijing (CN)

(72) Inventors: Lei Chen, Beijing (CN); Dan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 839 days.

(21) Appl. No.: 17/920,686

(22) PCT Filed: Jun. 8, 2021

(86) PCT No.: PCT/CN2021/098958
§ 371 (c)(1),
(2) Date: Oct. 21, 2022

(87) PCT Pub. No.: WO2022/017028
PCT Pub. Date: Jan. 27, 2022

(65) Prior Publication Data

US 2023/0141206 A1 May 11, 2023

(30) Foreign Application Priority Data

Jul. 23, 2020 (CN) ......................... 202010728215.0

(51) Int. Cl.
*H10K 85/60* (2023.01)
*H10K 85/40* (2023.01)
(Continued)

(52) U.S. Cl.
CPC ........... *H10K 85/615* (2023.02); *H10K 85/40* (2023.02); *H10K 85/636* (2023.02);
(Continued)

(58) Field of Classification Search
CPC ...... H10K 50/11; H10K 50/18; H10K 50/181; H10K 85/40; H10K 85/615; H10K 85/626;
(Continued)

(56) References Cited

U.S. PATENT DOCUMENTS 6,097,147 A 8/2000 Baldo et al.
2005/0067638 A1* 3/2005 Gupta .................... H10K 50/17 257/290
(Continued)

FOREIGN PATENT DOCUMENTS

CN 109390487 A 2/2019
CN 111092164 A 5/2020
(Continued)

*Primary Examiner* — Golam Mowla
(74) *Attorney, Agent, or Firm* — IPro, PLLC

(57) ABSTRACT

The present disclosure provides an organic light-emitting diode structure and a display device. The electron blocking layer, the luminescent layer and the hole blocking layer in the organic light-emitting diode structure satisfy: $HOMO_{host}-HOMO_{EBL}\leq0.3$ eV, $LUMO_{host}>LUMO_{HBL}$, and $HOMO_{HBL}-HOMO_{host}\geq0.1$ eV, wherein HOMO is the highest occupied molecular orbital, LUMO is the lowest unoccupied molecular orbital, host refers to the host material, EBL refers to the electron blocking layer, and HBL refers to the hole blocking layer.

15 Claims, 1 Drawing Sheet

(51) Int. Cl.
*H10K 101/30* (2023.01)
*H10K 102/00* (2023.01)

(52) U.S. Cl.
CPC ..... *H10K 85/6572* (2023.02); *H10K 85/6574* (2023.02); *H10K 85/6576* (2023.02); *H10K 2101/30* (2023.02); *H10K 2102/302* (2023.02)

(58) Field of Classification Search
CPC ............... H10K 85/636; H10K 85/653; H10K 85/6572; H10K 85/6574; H10K 85/6576
See application file for complete search history.

(56) References Cited

U.S. PATENT DOCUMENTS

| | | | |
|---|---|---|---|
| 2020/0127212 | A1 | 4/2020 | Adamovich et al. |
| 2020/0266379 | A1 | 8/2020 | Li et al. |

FOREIGN PATENT DOCUMENTS

| | | | |
|---|---|---|---|
| CN | 111293228 | A | 6/2020 |
| CN | 111864095 | A | 10/2020 |

* cited by examiner

ORGANIC LIGHT-EMITTING DIODE STRUCTURE AND DISPLAY DEVICE

CROSS REFERENCE TO RELEVANT APPLICATIONS

The present application claims the priority and the benefit of the patent application filed before the China National Intellectual Property Administration on Jul. 23, 2020 with the patent application number of 202010728215.0, which is incorporated herein in its entirety by reference.

TECHNICAL FIELD

The present disclosure relates to the field of chemical design of luminescent materials, and, particularly, the present disclosure relates to an organic light-emitting diode structure and a display device.

BACKGROUND

In recent years, organic electroluminescent displays (OLED), as a novel flat panel display, are paid increasingly more attention. Because of the characteristics such as active light emission, a high emitted-light brightness, a high resolution, a wide visual angle, a high response speed, a lower energy consumption and a good flexibility, OLEDs have become a very popular mainstream display product currently in the market. Furthermore, with the continuous development of the products, the users are requiring an increasingly higher resolution and an increasingly lower power consumption of the products. Therefore, it is required to develop devices of a high efficiency, a low voltage and a long life.

However, Red-green-blue (RGB) single-color OLED devices easily have attenuation in the life, ultimately because of the aging of the interface and the material deterioration caused by the defect of the material. Firstly, the aging of the interface is because too many electric charges accumulate due to an excessively large energy barrier at the interface. However, the blue-light host material (host) in organic luminescent (EL) devices requires a wide band gap, and therefore the energy level of its highest occupied molecular orbital (HOMO) is very deep, which results in a large energy-level difference between the hole-type electron blocking layer (EBL) and the host, whereby the existence of the energy barrier results in too much hole accumulation. Therefore, the interface easily deteriorates and the life of the device attenuates.

Secondly, in OLED devices, the material that most easily deteriorates is EBL materials. That is because the EBL materials themselves are generally an electron-rich system, and generally contain an aniline structure. Too many electrons have a repulsive force with the electron-rich structure of the EBL materials themselves. Such a repulsive force results in twisting of the δ bond of the benzene ring in the aniline (as shown in FIG. 1), and the defect caused by the bond breakage caused by the bond twisting is the primary cause of the life attenuation of the material and the device. Therefore, to reduce the electron accumulation in the EBL materials is a method for improving the stability of the device and increasing the life of the device. Furthermore, the overall exciton recombination region of the device is at the EBL/EML interface, and therefore the EBL materials definitely receive the accumulation of the electrons. Therefore, to improve the stability of the luminescent layer (EML) material is to improve the stability and the life of the device.

SUMMARY

The present disclosure is made on the basis of the following finding of the inventor:

The inventor of the present disclosure, in the studying process, takes into consideration the energy-level relation between the host material (host) and the guest material (dophant) of the luminescent layer, the energy-level relation between the host material and the guest material of the luminescent layer and the adjacent electron blocking layer (EBL) and hole blocking layer (HBL), the limitation on the mobility of the host material, and the characteristics of the structures of the host material and the guest material. That may increase the quantity of the holes in the EML, and reduce the electron accumulation at the EBL/EML interface. Moreover, the optimization of the stability of the host material may increase the life of the luminescent layer, and the optimization of the luminous efficiency of the guest material may improve the luminous efficiency of the luminescent layer.

In the first aspect of the present disclosure, the present disclosure provides an organic light-emitting diode structure.

According to an embodiment of the present disclosure, the organic light-emitting diode structure includes an anode, an electron blocking layer, a luminescent layer, a hole blocking layer and a cathode that are arranged in layer configuration, a material forming the luminescent layer includes a host material and a guest material, and the electron blocking layer, the luminescent layer and the hole blocking layer satisfy the following conditions:

$HOMO_{host}-HOMO_{EBL}\leq 0.3$ eV, $LUMO_{host}>LUMO_{HBL}$, and $HOMO_{HBL}-HOMO_{host}\geq 0.1$ eV, wherein $HOMO_{host}$ is a highest occupied molecular orbital of the host material, $LUMO_{host}$ is a lowest unoccupied molecular orbital of the host material, $HOMO_{EBL}$ is a highest occupied molecular orbital of the electron blocking layer, $HOMO_{HBL}$ is a highest occupied molecular orbital of the hole blocking layer, and $LUMO_{HBL}$ is a lowest unoccupied molecular orbital of the hole blocking layer.

The inventor has found out by studying that, in the organic light-emitting diode structure according to the embodiment of the present disclosure, the combination of the energy-level relation of the host material and the guest material of the luminescent layer and the adjacent electron blocking layer and hole blocking layer may enable the organic light-emitting diode structure to have a higher stability and a higher luminous efficiency, which may enable the organic light-emitting diode structure to have a longer service life and a lower power consumption.

Furthermore, the organic light-emitting diode structure according to the above embodiment of the present disclosure may also have the following additional technical features:

According to an embodiment of the present disclosure, the luminescent layer further satisfies the following conditions:

$HOMO_{dopant}\leq HOMO_{host}$, and $LUMO_{dopant}<LUMO_{host}$, wherein $HOMO_{dopant}$ is a highest occupied molecular orbital of the guest material, and $LUMO_{dopant}$ is a lowest unoccupied molecular orbital of the guest material.

According to an embodiment of the present disclosure, the host material has a structure I, and the guest material has a structure III, structure I

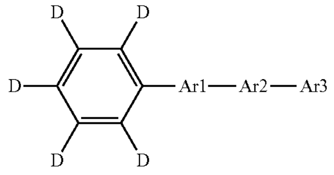

structure III

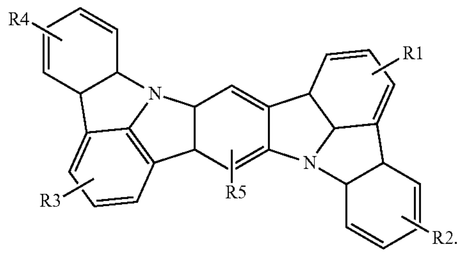

According to an embodiment of the present disclosure, a hole mobility/electron mobility of the host material is ≥0.001.

According to an embodiment of the present disclosure, substituents Ar1, Ar2 and Ar3 in the structure I are independently selected from optionally substituted aryl of a ring-carbon-atom quantity of 6-30 or heteroaryl of a ring-atom quantity of 5-20.

According to an embodiment of the present disclosure, the substituent Ar2 or Ar3 is an optionally substituted structure II, and a substituent X in the structure II is an oxygen atom, structure II

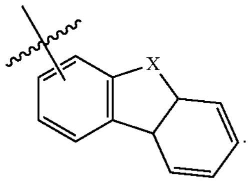

According to an embodiment of the present disclosure, the substituents Ar1, Ar2 and Ar3 in the structure I are independently selected from phenyl, naphthyl, anthryl, phenanthryl, dibenzofuran, dibenzothiophene, benzonaphthofuran and benzonaphthothiophene.

According to an embodiment of the present disclosure, the host material is selected from: 1-1, 1-2, 1-3, 1-4, 1-5, 1-6, 1-7, 1-8, 1-9, 1-10 and 1-11.

According to an embodiment of the present disclosure, an emission wavelength of the guest material is 400-500 nm.

According to an embodiment of the present disclosure, substituents R1, R2, R3, R4 and R5 in the structure III are independently selected from hydrogen, or optionally substituted heteroatom, amino, C1-20 alkyl, and aryl or heteroaryl of a ring-carbon-atom quantity of 6-20, wherein a substituent in the aryl or heteroaryl includes silyl, cyano, halogen or diplogen.

According to an embodiment of the present disclosure, R1, R2, R3, R4 and R5 are independently selected from methyl, tert-butyl, benzo, diphenylamino, 3-methyldiphenylamino and trimethylsilyl.

According to an embodiment of the present disclosure, the guest material is selected from: 2-1, 2-2, 2-3, 2-4, 2-5 and 2-6.

According to an embodiment of the present disclosure, a doping amount of the guest material is 1-10 wt %.

In the second aspect of the present disclosure, the present disclosure provides a display device.

According to an embodiment of the present disclosure, the display device includes the organic light-emitting diode structure stated above.

The inventor has found out by studying that, in the display device according to the embodiment of the present disclosure, its organic light-emitting diode structure has a higher stability and a higher luminous efficiency, which may enable the display device to have a longer service life and a lower power consumption. A person skilled in the art can understand that the features and the advantages described above with respect to the organic light-emitting diode structure are also suitable for the display device, and are not discussed herein further.

Some of the additional aspects and advantages of the present disclosure will be given in the following description, and some will become apparent from the following description or be known from the implementation of the present disclosure.

BRIEF DESCRIPTION OF THE DRAWINGS

The above-described aspects of the present disclosure will be interpreted with reference to the following description on the embodiments with reference to the drawings, wherein in the drawings.

REFERENCE NUMERALS

Figure 1:
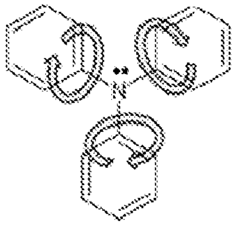
FIG. 1 is a schematic diagram of the principle of the twisting of the δ bond of the benzene ring in the aniline structure.

100 anode
200 hole injection layer
300 hole transporting layer
400 electron blocking layer
500 luminescent layer
600 hole blocking layer
700 electron transporting layer
800 electron injection layer
900 cathode

DETAILED DESCRIPTION

The embodiments of the present disclosure will be described in detail below. A person skilled in the art can understand that the following embodiments are intended to interpret the present disclosure, and should not be deemed as a limitation on the present disclosure. Unless indicated particularly, where the particular techniques or conditions of an embodiment in the following are not clearly described, a person skilled in the art may implement the embodiment by using commonly used techniques or conditions in the art or according to the specification of the product.

In an aspect of the present disclosure, the present disclosure provides an organic light-emitting diode structure.

Figure 3:
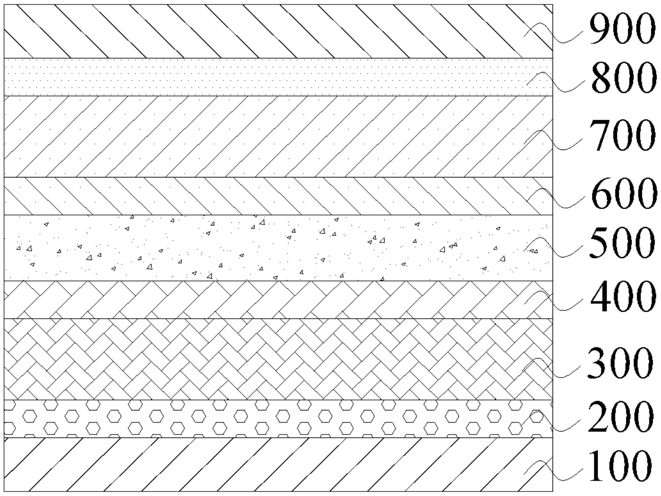
FIG. 3 is a schematic cross-sectional structural diagram of the organic light-emitting diode according to an embodiment of the present disclosure.

According to an embodiment of the present disclosure, the organic light-emitting diode structure includes an anode, an electron blocking layer, a luminescent layer, a hole blocking layer and a cathode that are arranged in layer configuration. In some embodiments of the present disclosure, referring to FIG. 3, the organic light-emitting diode structure may include an anode 100, a hole injection layer 200, a hole transporting layer 300, an electron blocking layer 400, a luminescent layer 500, a hole blocking layer 600, an electron transporting layer 700, an electron injection layer 800 and a cathode 900 that are arranged in layer configuration. Accordingly, both of the structure and the function of the organic light-emitting diode structure may be further improved.

Figure 2:
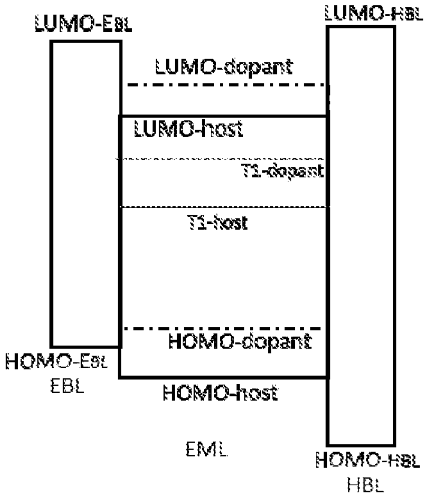
FIG. 2 is a schematic diagram of the energy-level relation of the host and the guest of the luminescent material and the adjacent layers.

The inventor of the present disclosure has found out in the studying process that, referring to the schematic diagram of the energy-level relation of the host and the guest of the luminescent material and the adjacent layers shown in FIG. 2, the energy-level relation of the host material (host) and the guest material (dophant) of the luminescent layer (EML) and the electron blocking layer (EBL) and the hole blocking layer (HBL) adjacent to the luminescent layer (all of the relations of the magnitudes are absolute values, HOMO is the highest occupied molecular orbital, and LUMO is the lowest unoccupied molecular orbital) is required to satisfy the following 3 conditions: (1) $HOMO_{host}-HOMO_{EBL}\leq 0.3$ eV, whereby reducing the energy-level gap may increase the hole transport; (2) $HOMO_{HBL}-HOMO_{host}\geq 0.1$ eV, which facilitates the blocking of the holes; and (3) $LUMO_{host}>LUMO_{HBL}$, which facilitates the transport of the electrons. Accordingly, the inventor configures the combination of the energy levels of the components, which may facilitate the transport of the charge carriers into the luminescent layer, thereby reducing the accumulation of the charge carriers at the EBL/EML interface.

In some embodiments of the present disclosure, (4) $HOMO_{dopant}\leq HOMO_{host}$, which facilitates the guest material to capture some holes; and (5) $LUMO_{dopant}<LUMO_{host}$, which may scatter some electrons. Accordingly, the inventor regulates the combination of the energy levels of the host material and the guest material, which may further facilitate the transport of the charge carriers into the luminescent layer, thereby further reducing the accumulation of the charge carriers at the EBL/EML interface.

According to an embodiment of the present disclosure, a material forming the luminescent layer includes a host material and a guest material, wherein the host material has a structure I, and the guest material has a structure III. All of the 5 hydrogen atoms in the benzene ring at one end of the host material are replaced by diplogen atoms, which may increase the bond energy between the benzene ring and the substituent Ar1, thereby enabling the host material to have a better stability. Moreover, the structure III is selected by the intermediate structure of the guest material, this fused structure may reduce the wagging vibration and the stretching vibration of the atoms, reduce non-radiative transition, and purify the spectral colors, thereby increasing the front-face luminous efficiency of the luminescent material.

structure I

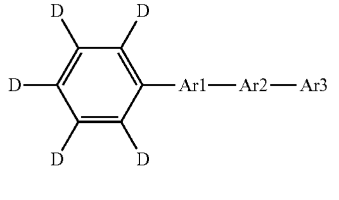

-continued structure III

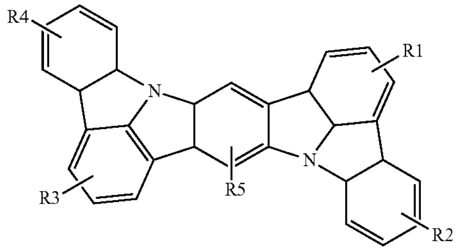

By using the AC3 test, the $HOMO_{host}$ of the host material having the structure I is 5.8-5.9 eV, the $LUMO_{host}$ is 2.9-3.0 eV; the $HOMO_{dopant}$ of the guest material having the structure III is 5.1-5.4 eV, and the $LUMO_{dopant}$ is 2.5-2.7 eV; the $HOMO_{EBL}$ of the material forming the electron blocking layer (for example, mCBP) is 5.6-5.7 eV; and the $HOMO_{HBL}$ of the material forming the hole blocking layer (for example, TPBI) is 6.1-6.3 eV, and the $LUMO_{HBL}$ is 2.3-2.5 eV. Accordingly, the host material forming the luminescent layer has the structure I and the guest material has the structure III, which may satisfy the following formulas: (1) $HOMO_{host}-HOMO_{EBL}\leq 0.3$ eV; (2) $HOMO_{HBL}-HOMO_{host}\geq 0.1$ eV; (3) $LUMO_{host}>LUMO_{HBL}$; (4) $HOMO_{dopant}\leq HOMO_{host}$; and (5) $LUMO_{dopant}<LUMO_{host}$.

According to an embodiment of the present disclosure, in the structure I of the host material, the substituents Ar1, Ar2 and Ar3 may be independently selected from optionally substituted aryl of a ring-carbon-atom quantity of 6-30 or heteroaryl of a ring-atom quantity of 5-20. Accordingly, by selecting rigid aryl or heteroaryl as the substituents of the host material, the host material may have a better stability. In some embodiments of the present disclosure, the aryl of a ring-carbon-atom quantity of 6-30 may be at least one of phenyl, naphthyl, anthryl and phenanthryl. In some other embodiments of the present disclosure, the heteroaryl of a ring-atom quantity of 5-20 may be at least one of dibenzofuran, dibenzothiophene, benzonaphthofuran and benzonaphthothiophene. Accordingly, by selecting the above substituents of a strong conjugacy, the host material may have a better luminous performance.

In some particular embodiments of the present disclosure, the substituent Ar2 or Ar3 may be an optionally substituted structure II, and the substituent X in the structure II may be an oxygen atom (O). Accordingly, by selecting dibenzofuran as the substituent Ar2 or Ar3, that may further facilitate the transport of the holes.

structure II

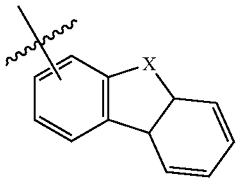

In some particular embodiments, the host material may be selected from one of the following 11 compounds. Accordingly, by selecting any one of 1-1 to 1-11, the hole mobility/electron mobility in the mobility of the host material (measured by using the SCLC method) may be ≥0.001, thereby further facilitating the transport of the holes. In some particular embodiments, the host material in the luminescent layer may be 1-2 or 1-7, which may increase the service life of the organic light emitting diode by above 20%.
1-1
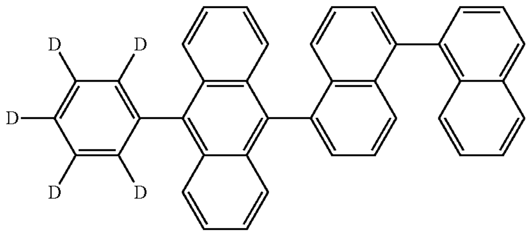
1-2
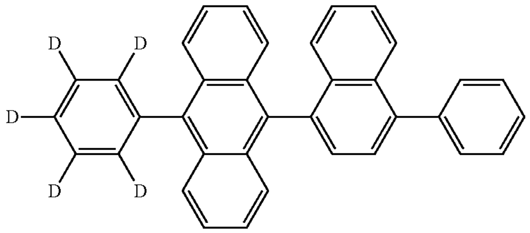
1-3
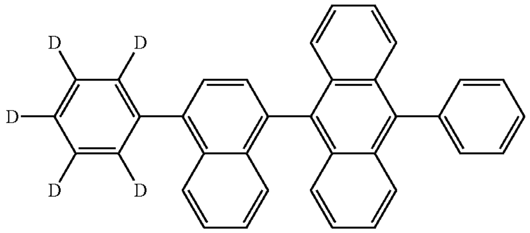
1-4
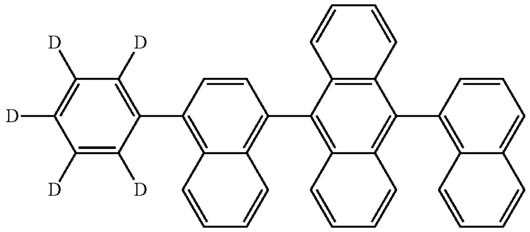
1-5
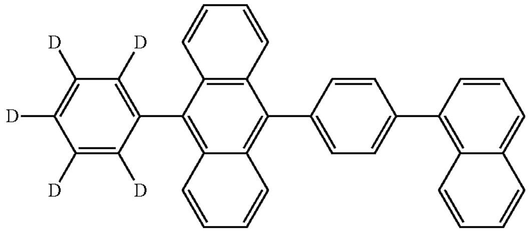
-continued
1-6
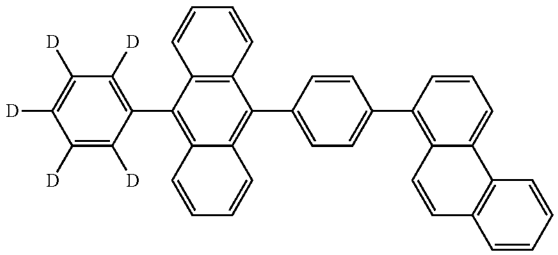
1-7
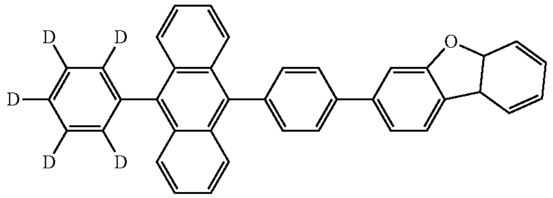
1-8
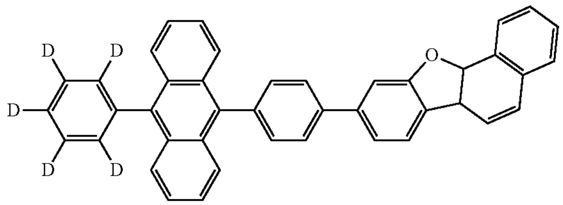
1-9
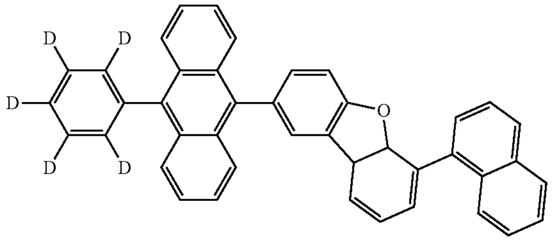
1-10
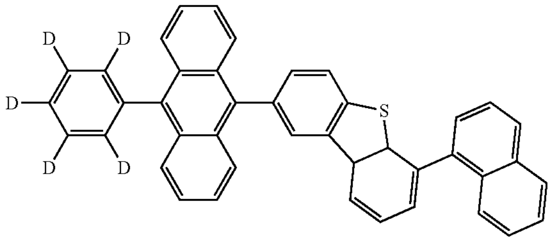
1-11
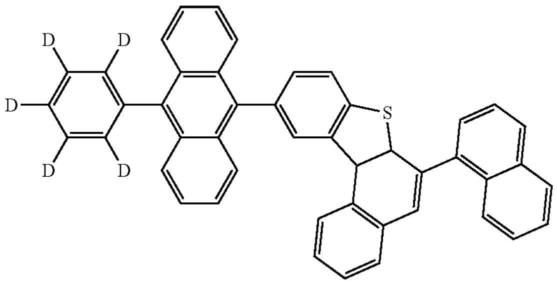

According to an embodiment of the present disclosure, in the structure III of the guest material, the substituents R1, R2, R3, R4 and R5 may be independently selected from hydrogen, or optionally substituted heteroatom, amino, C1-20 alkyl, and aryl or heteroaryl of a ring-carbon-atom quantity of 6-20, wherein a substituent in the aryl or heteroaryl includes silyl, cyano, halogen or diplogen. Accordingly, by selecting the above chemical groups as the five substituents in the structure III, the luminescent material may have a higher front-face luminous efficiency. Furthermore, the adjacent substituents R1-R5 may form a ring, or be integrated with the benzene ring to form fused aromatic hydrocarbons.

In some embodiments of the present disclosure, R1, R2, R3, R4 and R5 may be independently selected from methyl, tert-butyl, benzo, diphenylamino, 3-methyldiphenylamino and trimethylsilyl. Accordingly, by selecting the above types of substituents, the rigidity of the guest material may be further increased, whereby the luminescent material may have a higher front-face luminous efficiency.

In some particular embodiments, the guest material may be selected from one of the following 6 compounds. Accordingly, by selecting any one of 2-1 to 2-6, the emission wavelength of the guest material may be between 400 nm and 500 nm, which cannot only increase the rigidity of the guest material, but may also enable the light emitted by the luminescent material to have a higher color purity. In some particular embodiments, the guest material may be 2-3 or 2-5, which may increase the luminous efficiency of the organic light emitting diode by above 10%.

2-1

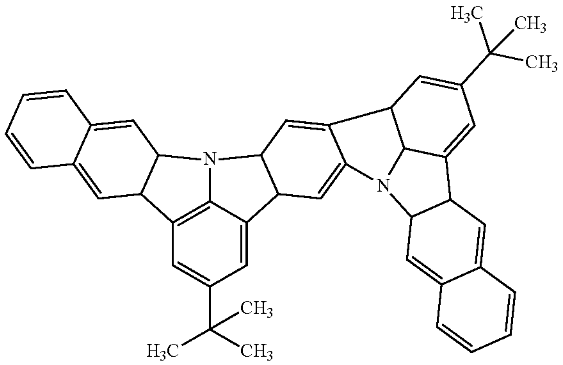

2-2

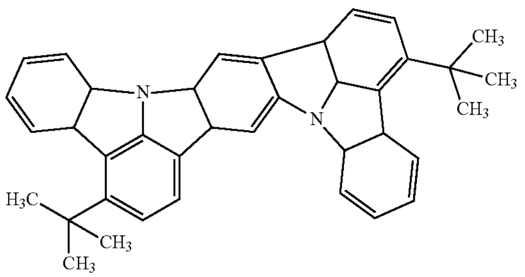

-continued 2-3

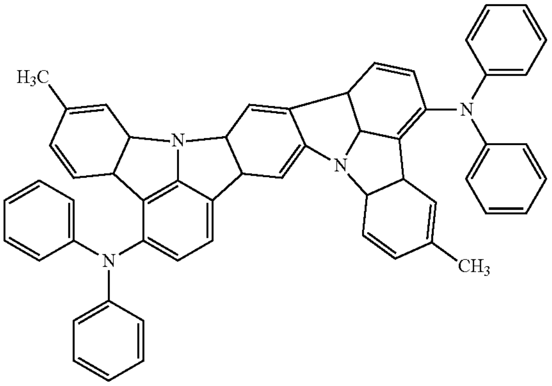

2-4

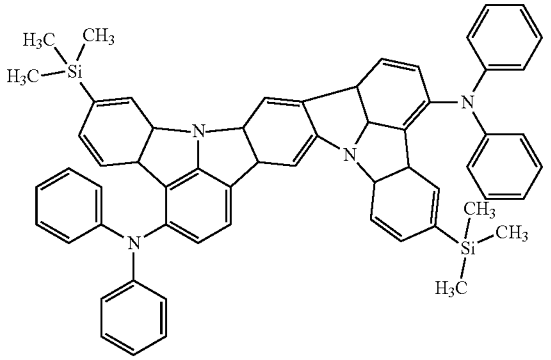

2-5

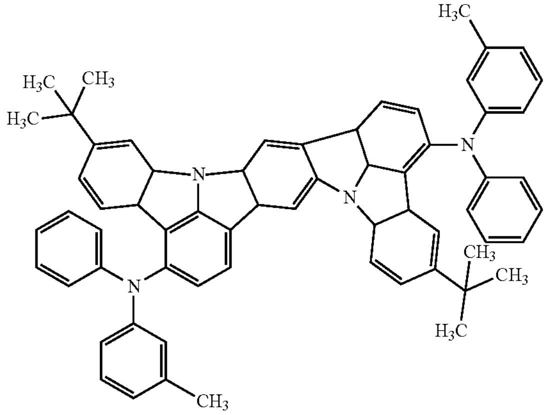

-continued 2-6

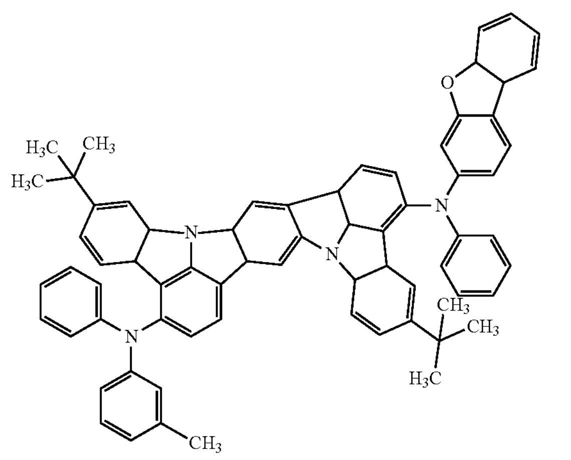

According to an embodiment of the present disclosure, based on the total weight of the luminescent-material composition, the doping amount of the guest material may be 1-10 wt %. Accordingly, by merely adding the guest material 1/99-1/9 of the weight of the host material, the service life of the organic light emitting diode containing the luminescent layer may be increased by above 20% and at the same time the luminous efficiency may be increased by above 10%.

According to an embodiment of the present disclosure, the material forming the hole injection layer (HIL) 200 may be an inorganic oxide, which particularly includes, for example, molybdenum oxide, titanium oxide, vanadium oxide, rhenium oxide, ruthenium oxide, chromium oxide, zirconium oxide, hafnium oxide, tantalum oxide, silver oxide, tungsten oxide and manganese oxide. It may also be a P-type dopant of a strong electrophilic system and a dopant of a hole transport material, which particularly includes, for example, hexacyanohexazatriphenylene, 2,3,5,6-tetrafluoro-7,7,8,8-tetracyanoparaquinonedimethane (F4TCNQ), and 1,2,3-tri[(cyano)(4-cyano-2,3,5,6-tetrafluorophenyl) methylene] cyclopropane.

According to an embodiment of the present disclosure, the materials forming the hole transporting layer (HTL) 300 and the electron blocking layer (EBL) 400 may independently be an arylamine-type or carbazole-type material having the characteristic of hole transport, which particularly includes, for example, 4,4'-bis[N-(1-naphthyl)-N-phenylamino] biphenyl (NPB), N,N'-bis(3-methylphenyl)-N,N'-diphenyl-[1,1'-biphenyl]-4,4'-diamine (TPD), 4-phenyl-4'-(9-phenylfluoren-9-yl)triphenylamine (BAFLP), 4,4'-bis[N-(9,9-dimethylfluoren-2-yl)-N-phenylamino] biphenyl (DFLDPBi), 4,4'-di(9-carbazolyl) biphenyl (CBP), and 9-phenyl-3-[4-(10-phenyl-9-anthryl) phenyl]-9H-carbazole (PCzPA).

According to an embodiment of the present disclosure, the materials forming the hole blocking layer (HBL) 600 and the electron transporting layer (ETL) 700 may independently be an aromatic heterocyclic compound, which includes, for example, a benzimidazole derivative, an imidazopyridine derivative, an imidazole derivative such as a benziimidazophenanthridine derivative, a pyrimidine derivative, an azine derivative such as a triazine derivative, and a compound containing a nitrogen-containing six-membered ring such as a phenanthroline derivative, a quinoline derivative, an iso-quinoline derivative. It also includes a compound in which a heterocyclic ring has a phosphine-oxide-series substituent, which particularly includes, for example, 2-(4-biphenyl)-5-(4-tert-butylphenyl)-1,3,4-oxadiazole (PBD), 1,3-bis[5-(p-tert-butylphenyl)-1,3,4-oxadiazol-2-yl] benzene (OXD-7), 3-(4-tert-butylphenyl)-4-phenyl-5-(4-biphenyl)-1,2,4-triazole (TAZ), 3-(4-tert-butylphenyl)-4-(4-ethylphenyl)-5-(4-biphenyl)-1,2,4-triazole (p-EtTAZ), bathophenanthroline (BPhen), bathocuproine (BCP), and 4,4'-bis(5-methylbenzoxazol-2-yl) stilbene (BzOs).

According to an embodiment of the present disclosure, the material forming the electron injection layer (EIL) 800 may be an alkali metal or a metal, which particularly includes, for example, LiF, Yb, Mg, Ca and compounds thereof.

In conclusion, according to the embodiments of the present disclosure, the present disclosure provides an organic light-emitting diode structure, wherein the combination between the energy-level relation of the host material and the guest material of the luminescent layer and the adjacent electron blocking layer and hole blocking layer may enable the organic light-emitting diode structure to have a higher stability and a higher luminous efficiency, which may enable the organic light-emitting diode structure to have a longer service life and a lower power consumption.

In another aspect of the present disclosure, the present disclosure provides a display device. According to an embodiment of the present disclosure, the display device includes the organic light-emitting diode structure stated above.

According to an embodiment of the present disclosure, the particular type of the display device is not particularly limited, and particularly includes, for example, a display screen, a television set, a mobile phone, a tablet personal computer and a smart watch, which may be selected by a person skilled in the art correspondingly according to the practical usage requirements of the display device, and are not discussed herein further. It should be noted that, besides the organic light-emitting diode structure, the display device further includes other necessary components and elements, and, taking an OLED display screen as an example, particularly includes, for example, a displaying back plate, a thin-film transistor and a touch component, which may be added by a person skilled in the art correspondingly according to the functions of the display device, and are not discussed herein further.

In conclusion, according to the embodiments of the present disclosure, the present disclosure provides a display device, wherein its organic light-emitting diode structure has a higher stability and a higher luminous efficiency, which may enable the display device to have a longer service life and a lower power consumption. A person skilled in the art can understand that the features and the advantages described above with respect to the organic light-emitting diode structure apply to the display device, and are not discussed herein further.

The present disclosure will be described below with reference to the particular embodiments. It should be noted that those embodiments are merely illustrative, and do not limit the present disclosure in any way.

COMPARATIVE EXAMPLE 1

In this comparative example, an organic light-emitting diode is fabricated. The material of the luminescent layer is a comparative host material and a comparative guest material, the material of HIL is F4TCNQ, the material of HTL is m-MTDATA, the material of EBL is mCBP, the material of HBL is TPBI, and the material of ETL is BCP.

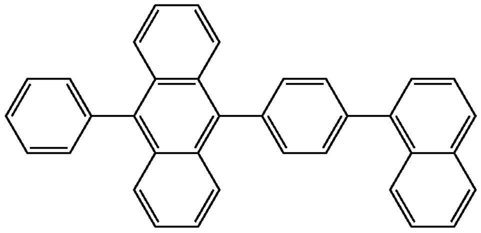 [SMILES: c1ccc(-c2c3ccccc3c(-c3ccc(-c4cccc5ccccc45)cc3)c3ccccc23)cc1]

comparative host material (comparative host)

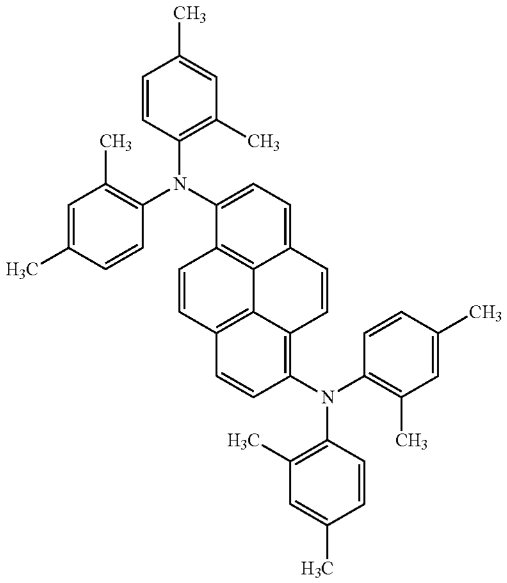

comparative guest material (comparative dopant)

HIL

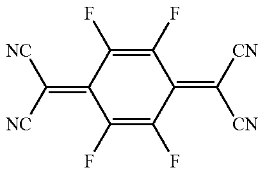

-continued

HTL

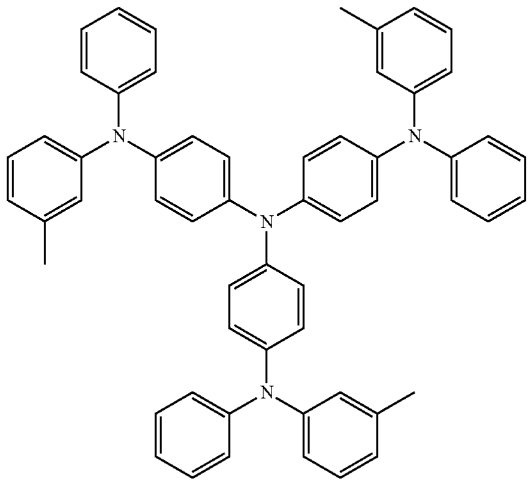

EBL

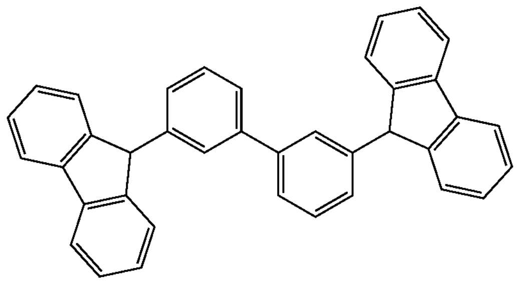

HBL

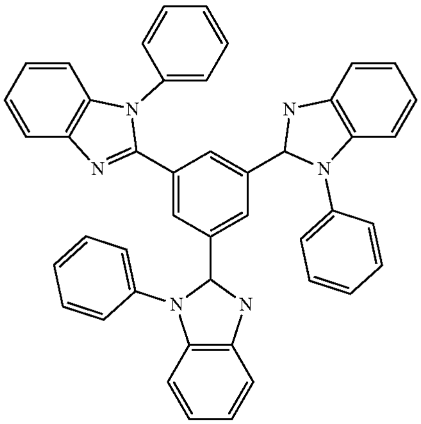

ETL

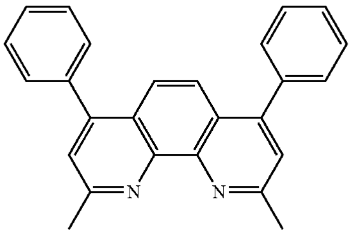

COMPARATIVE EXAMPLE 2

In this comparative example, an organic light-emitting diode is fabricated. It differs from Comparative Example 1 in that the host material of the luminescent layer is 1-2.

COMPARATIVE EXAMPLE 3

In this comparative example, an organic light-emitting diode is fabricated. It differs from Comparative Example 1 in that the host material of the luminescent layer is 1-7.

COMPARATIVE EXAMPLE 4

In this comparative example, an organic light-emitting diode is fabricated. It differs from Comparative Example 1 in that the guest material of the luminescent layer is 2-3.

COMPARATIVE EXAMPLE 5

In this comparative example, an organic light-emitting diode is fabricated. It differs from Comparative Example 1 in that the guest material of the luminescent layer is 2-5.

EXAMPLE 1

In this Example, an organic light-emitting diode is fabricated. It differs from Comparative Example 1 in that the host material of the luminescent layer is 1-7 and the guest material is 2-3.

EXAMPLE 2

In this Example, an organic light-emitting diode is fabricated. It differs from Comparative Example 1 in that the host material of the luminescent layer is 1-7 and the guest material is 2-5.

EXAMPLE 3

In this Example, an organic light-emitting diode is fabricated. It differs from Comparative Example 1 in that the host material of the luminescent layer is 1-2 and the guest material is 2-3.

EXAMPLE 4

In this Example, an organic light-emitting diode is fabricated. It differs from Comparative Example 1 in that the host material of the luminescent layer is 1-2 and the guest material is 2-5.

SUMMARY

Tests on the voltages, the luminous efficiencies and the lives are performed on the organic light-emitting diodes of Comparative Example 1-5 and Examples 1-4, wherein the life tests follow LT95@1000 nit. The test results of the organic light emitting diodes are shown in Table 1.

TABLE 1

The test results of the OLEDs of the comparative examples and examples

| material combination | | voltage | luminous efficiency | life |
|---|---|---|---|---|
| comparative host | comparative dopant | 100% | 100% | 100% |
| host 1-2 | comparative dopant | 100% | 102% | 120% |
| host 1-7 | comparative dopant | 98% | 105% | 129% |
| comparative host | dopant 2-3 | 98% | 113% | 103% |
| comparative host | dopant 2-5 | 96% | 119% | 104% |
| host 1-7 | dopant 2-3 | 96% | 118% | 131% |
| host 1-7 | dopant 2-5 | 94% | 123% | 137% |
| host 1-2 | dopant 2-3 | 99% | 115% | 126% |
| host 1-2 | dopant 2-5 | 97% | 120% | 130% |

In the description of the present disclosure, the description referring to the terms "an embodiment", "some embodiments", "example", "particular example" or "some examples" and so on means that particular features, structures, materials or characteristics described with reference to the embodiment or example are comprised in at least one of the embodiments or examples of the present disclosure. In the description, the illustrative expressions of the above terms do not necessarily relate to the same embodiment or example. Furthermore, the described particular features, structures, materials or characteristics may be combined in one or more embodiments or examples in a suitable form. Moreover, subject to avoiding contradiction, a person skilled in the art may combine different embodiments or examples described in the description and the features of the different embodiments or examples.

Although the embodiments of the present disclosure have already been illustrated and described above, it can be understood that the above embodiments are illustrative, and should not be construed as a limitation on the present disclosure, and a person skilled in the art may make variations, modifications, substitutions and improvements to the above embodiments within the scope of the present disclosure.

The invention claimed is:

1. An organic light-emitting diode structure, wherein the organic light-emitting diode structure comprises an anode, an electron blocking layer, a luminescent layer, a hole blocking layer and a cathode that are arranged in layer configuration, a material forming the luminescent layer comprises a host material and a guest material, and the electron blocking layer, the luminescent layer and the hole blocking layer satisfy the following conditions:

$HOMO_{host}-HOMO_{EBL} \leq 0.3$ eV, $LUMO_{host} > LUMO_{HBL}$, and $HOMO_{HBL}-HOMO_{host} \geq 0.1$ eV, wherein $HOMO_{host}$ is a highest occupied molecular orbital of the host material, $LUMO_{host}$ is a lowest unoccupied molecular orbital of the host material, $HOMO_{EBL}$ is a highest occupied molecular orbital of the electron blocking layer, $HOMO_{HBL}$ is a highest occupied molecular orbital of the hole blocking layer, and $LUMO_{HBL}$ is a lowest unoccupied molecular orbital of the hole blocking layer;

wherein the host material has a structure I, and the guest material has a structure III, structure I

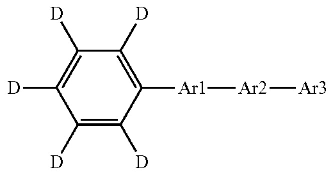

-continued structure III

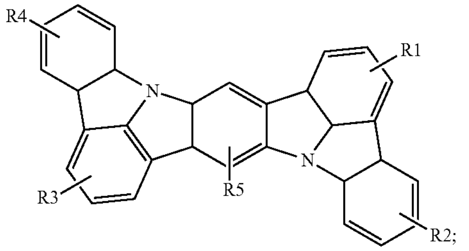

substituents Ar1, Ar2 and Ar3 in the structure I are independently selected from optionally substituted aryl of a ring-carbon-atom quantity of 6-30 or heteroaryl of a ring-atom quantity of 5-20; and substituents R1, R2, R3, R4 and R5 in the structure III are independently selected from hydrogen, or optionally substituted heteroatom, amino, C1-20 alkyl, and aryl or heteroaryl of a ring-carbon-atom quantity of 6-20, wherein a substituent in the aryl or heteroaryl comprises silyl, cyano, halogen or diplogen.

2. The organic light-emitting diode structure according to claim 1, wherein the luminescent layer further satisfies the following conditions:

$HOMO_{dopant} \leq HOMO_{host}$, and $LUMO_{dopant} < LUMO_{host}$, wherein $HOMO_{dopant}$ is a highest occupied molecular orbital of the guest material, and $LUMO_{dopant}$ is a lowest unoccupied molecular orbital of the guest material.

3. The organic light-emitting diode structure according to claim 1, wherein a hole mobility/electron mobility of the host material is ≥0.001.

4. The organic light-emitting diode structure according to claim 1, wherein the substituent Ar2 or Ar3 is an optionally substituted structure II, and a substituent X in the structure II is an oxygen atom, structure II

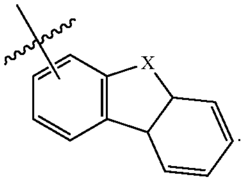

5. The organic light-emitting diode structure according to claim 1, wherein the substituents Ar1, Ar2 and Ar3 in the structure I are independently selected from phenyl, naphthyl, anthryl, phenanthryl, dibenzofuran, dibenzothiophene, benzonaphthofuran and benzonaphthothiophene.

6. The organic light-emitting diode structure according to claim 5, wherein the host material is selected from:

1-1

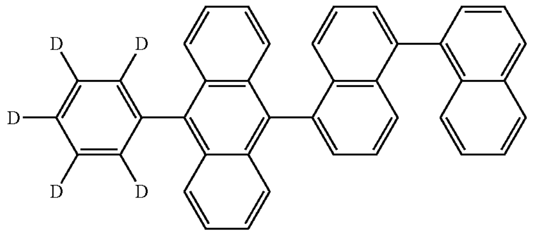

1-2

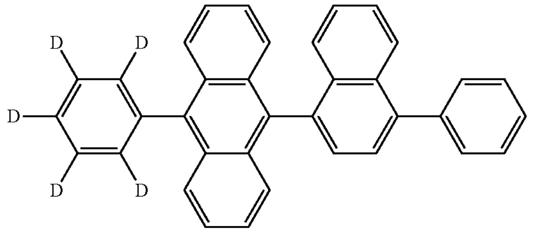

1-3

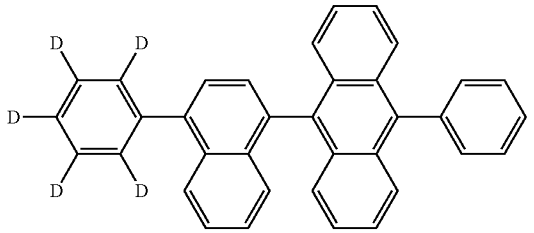

1-4

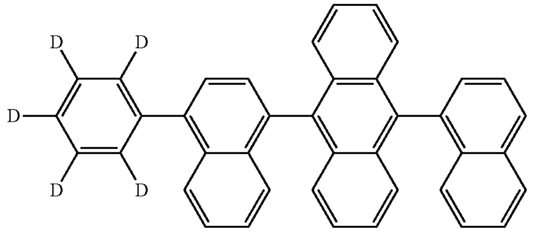

1-5

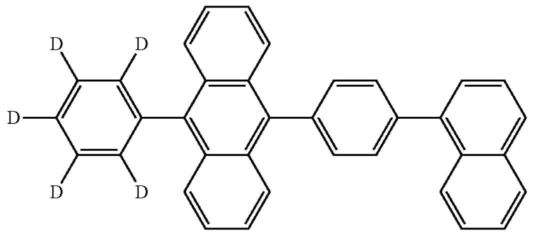

-continued 1-6

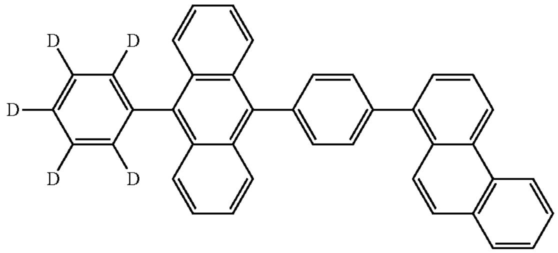

1-7

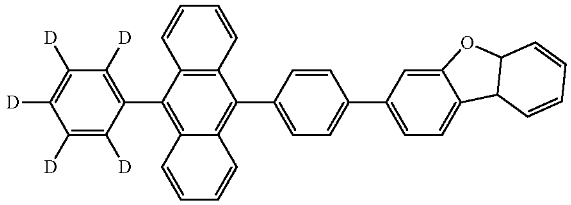

1-8

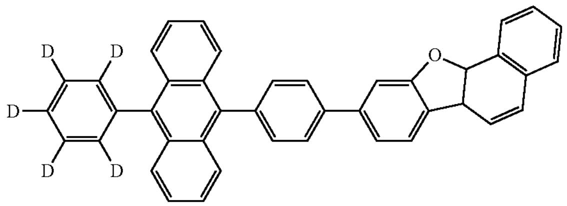

1-9

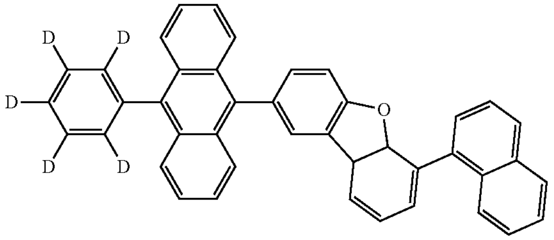

1-10

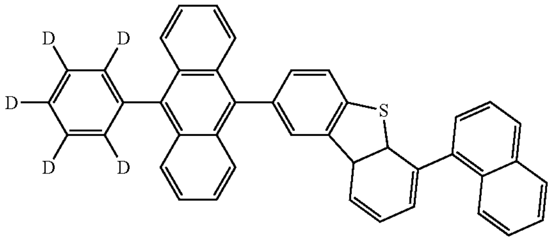

-continued 1-11

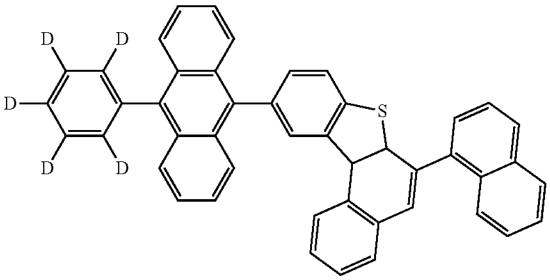

.

7. The organic light-emitting diode structure according to claim 1, wherein an emission wavelength of the guest material is 400-500 nm.

8. The organic light-emitting diode structure according to claim 1, wherein R1, R2, R3, R4 and R5 are independently selected from methyl, tert-butyl, benzo, diphenylamino, 3-methyldiphenylamino and trimethylsilyl.

9. The organic light-emitting diode structure according to claim 8, wherein the guest material is selected from:

2-1

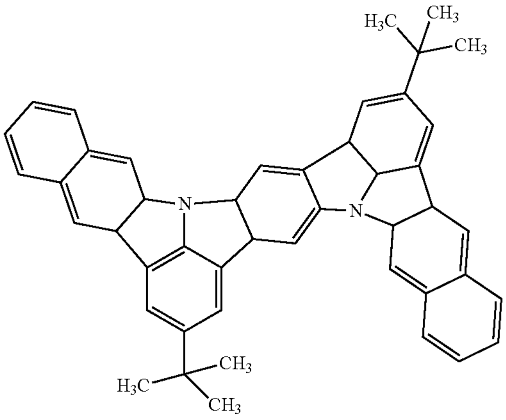

2-2

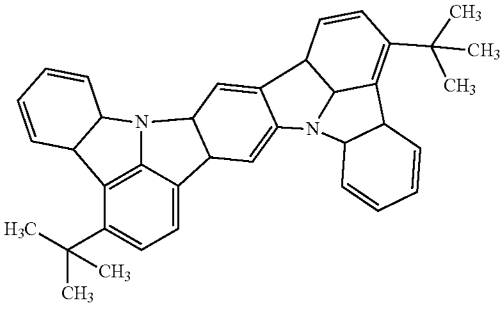

-continued 2-3

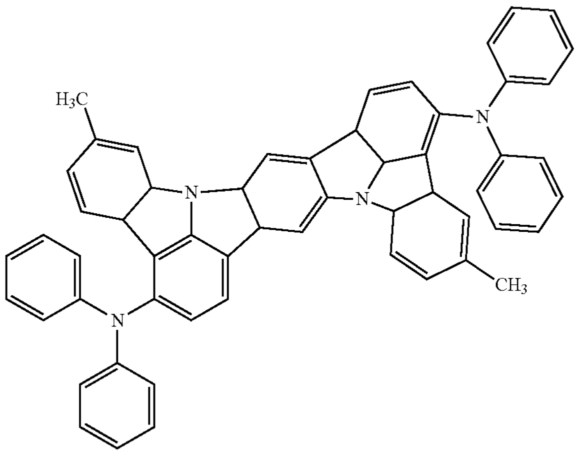

2-4

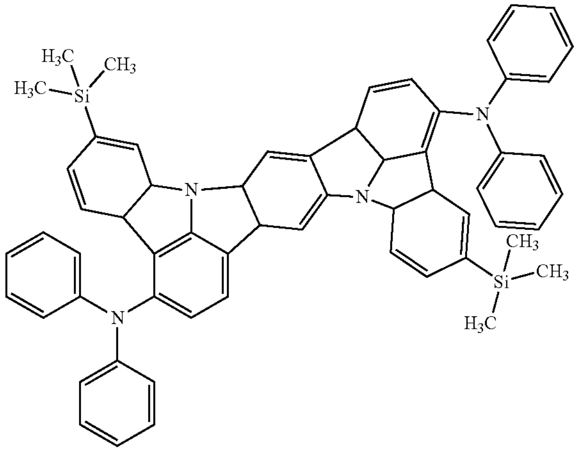

2-5

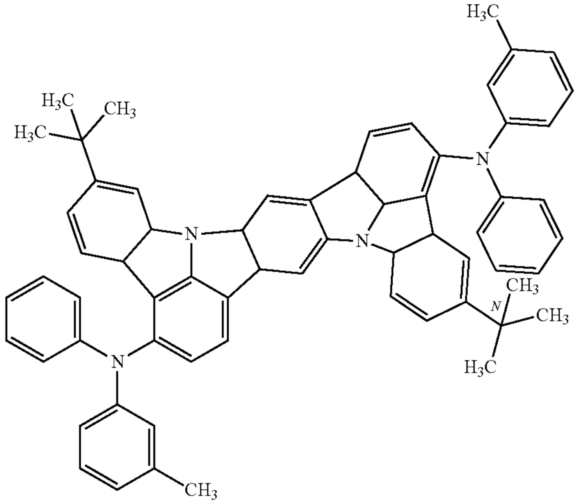

-continued 2-6

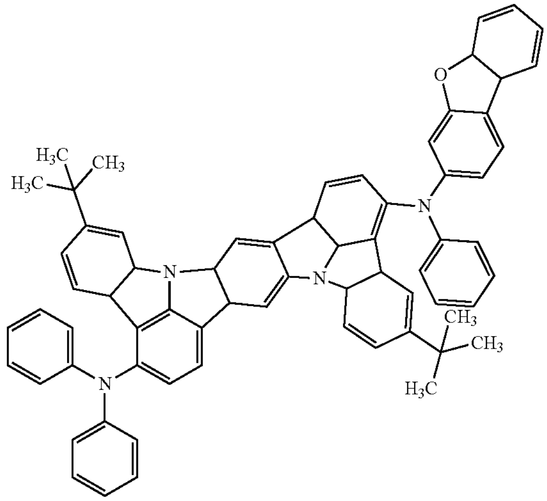

.

10. The organic light-emitting diode structure according to claim 1, wherein a doping amount of the guest material is 1-10 wt %.

11. A display device, wherein the display device comprises the organic light-emitting diode structure according to claim 1.

12. The display device according to claim 11, wherein the luminescent layer further satisfies the following conditions:

$HOMO_{dopant} \leq SHOMO_{host}$, and $LUMO_{dopant} < LUMO_{host}$, wherein $HOMO_{dopant}$ is a highest occupied molecular orbital of the guest material, and LUMO dopant is a lowest unoccupied molecular orbital of the guest material.

13. The display device according to claim 11, wherein a hole mobility/electron mobility of the host material is ≥0.001.

14. The display device according to claim 11, wherein the substituent Ar2 or Ar3 is an optionally substituted structure II, and a substituent X in the structure II is an oxygen atom, structure II

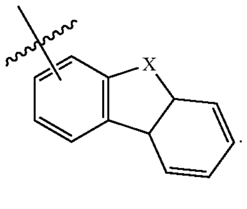

15. The display device according to claim 11, wherein the substituents Ar1, Ar2 and Ar3 in the structure I are independently selected from phenyl, naphthyl, anthryl, phenanthryl, dibenzofuran, dibenzothiophene, benzonaphthofuran and benzonaphthothiophene.

* * * * *